United States Patent
Kihara

(10) Patent No.: US 10,082,820 B1
(45) Date of Patent: Sep. 25, 2018

(54) POWER CONTROL CIRCUIT AND LOGIC CIRCUIT DEVICE HAVING THE SAME

(71) Applicant: Powerchip Technology Corporation, Hsinchu (TW)

(72) Inventor: Yuji Kihara, Tokyo (JP)

(73) Assignee: Powerchip Technology Corporation, Hsinchu (TW)

( * ) Notice: Subject to any disclaimer, the term of this patent is extended or adjusted under 35 U.S.C. 154(b) by 0 days.

(21) Appl. No.: 15/865,262

(22) Filed: Jan. 9, 2018

(30) Foreign Application Priority Data

Aug. 29, 2017 (JP) ................................. 2017-164513

(51) Int. Cl.
*H03K 19/173* (2006.01)
*G05F 5/00* (2006.01)
*G08C 19/16* (2006.01)
*G06F 17/50* (2006.01)

(52) U.S. Cl.
CPC ............ *G05F 5/00* (2013.01); *G06F 17/5022* (2013.01); *G08C 19/16* (2013.01); *H03K 19/173* (2013.01)

(58) Field of Classification Search
CPC ....... G05F 5/00; G06F 17/5022; G08C 19/16; H03K 19/173
USPC .......................................................... 326/33
See application file for complete search history.

(56) References Cited

U.S. PATENT DOCUMENTS

| 5,434,824 | A | * | 7/1995 | Matsuzaki | G11C 8/18 365/189.07 |
| 6,643,162 | B2 | * | 11/2003 | Takeuchi | G11C 11/22 327/530 |
| 7,543,163 | B2 | | 6/2009 | Kernahan et al. | |

FOREIGN PATENT DOCUMENTS

| CN | 101278459 | 10/2008 |
| JP | 2011186934 | 9/2011 |
| JP | 2014038382 | 2/2014 |
| TW | I568181 | 1/2017 |

* cited by examiner

*Primary Examiner* — Daniel D Chang
(74) *Attorney, Agent, or Firm* — JCIPRNET

(57) ABSTRACT

The power control circuit of the disclosure is configured for a logic circuit performing a predetermined logic calculation on a plurality of input signals from a memory part and outputting a plurality of output signals after logic calculation. The power control circuit includes a switch part that switches between whether to supply a power voltage to the logic circuit or not; a plurality of detector circuits that respectively detect change of signal level of the input signals, wherein when the change of signal level is detected, detect signals are output respectively; and a control circuit that controls the switch part to supply power voltage to the logic circuit based on at least one detect signal from the detector circuits, wherein on the other hand, when the detect signal is not output from the detector circuits, controls the switch part not to supply power voltage to the logic circuit.

6 Claims, 16 Drawing Sheets

POWER CONTROL CIRCUIT AND LOGIC CIRCUIT DEVICE HAVING THE SAME

CROSS-REFERENCE TO RELATED APPLICATION

This application claims the priority benefit of Japan application serial no. 2017-164513, filed on Aug. 29, 2017. The entirety of the above-mentioned patent application is hereby incorporated by reference herein and made a part of this specification.

TECHNICAL FIELD

The disclosure is related to a power control circuit used for a logic circuit and a logic circuit device having the power control circuit.

DESCRIPTION OF RELATED ART

FIG. 1 is a block diagram illustrating a logic circuit and a structure of a power control circuit thereof according to a conventional example 1. As shown in FIG. 1, a logic circuit 10 is generally disposed between delay type flip-flops FFI1-FFIM at an input side and delay types flip-flop FFO1-FFON at an output side, and has gate elements like an inverter INV1, a NOR gate NOR1 and an NAND gate NAND1 to perform predetermined logic calculation. Meanwhile, a power voltage Vdd is supplied to the logic circuit 10 and various delay type flip-flops FFI1-FFIM and FFO1-FFON. In FIG. 1, in the logic circuit, ideally there is no leak path, and there is no current flowing in a state that the logic circuit is not operated.

However, when the logic circuit is in a standby state, there is only leakage current, but if manufactured by using known miniaturization technology, the leakage current is increased. Currently, it is not possible to maintain low current in current state, when there is large leakage (one of defects) in the logic circuit, large current flows.

To solve the above-mentioned problem, a power voltage blocking circuit is provided, which can effectively reduce leakage current. One example is shown in FIG. 2 to FIG. 4.

FIG. 2 is a block diagram illustrating a logic circuit and a structure of a power control circuit thereof according to a conventional example 2. As compared with the circuit in FIG. 1, in the circuit of FIG. 2, the power voltage Vdd is supplied to the logic circuit 10 and various delay type flip-flops FFI1-FFIM and FFO1-FFON via a metal oxide semiconductor (MOS) transistor Q1. The MOS transistor Q1 is controlled based on a power blocking signal Spsco from a central processing unit (CPU). When the logic circuit 10 is not operated, the MOS transistor Q1 is turned off based on the power blocking signal Spsco at an H level, thereby reducing the current in the standby state.

FIG. 3 is a block diagram illustrating a logic circuit and a structure of a power control circuit thereof according to a conventional example 3. As compared with the circuit of FIG. 2, in the circuit of FIG. 3, the power voltage Vdd is supplied to one application function unit, i.e., logic circuit 10, via the MOS transistor Q1, and the MOS transistor Q1 is controlled based on the power blocking signal Spsco from the CPU, but the power voltage Vdd is directly supplied to various delay flip-flops FFI1-FFIM and FFO1-FFON without via the MOS transistor Q1. At this time, relative to each of the application function units, when the logic circuit 10 is not operated, the MOS transistor Q1 is also turned off, thereby reducing the current in the standby state.

FIG. 4 is a block diagram illustrating a logic circuit and a structure of a power control circuit thereof according to a conventional example 4. In the circuit of FIG. 4, the power voltage Vdd serves as a supply voltage Vdd1 supplied to the logic circuits 10, 11 and 12, the delay type flip-flops FFI1-FFIM at the input side and the delay type flip-flops FFO1-FFON at the output side via the MOS transistor Q1 that serves as the power voltage blocking circuit. It is reflected that one power voltage Vdd is supplied to a plurality of logic circuit blocks via the MOS transistor Q1 that serves as the power voltage blocking circuit.

As a control method of supplying power voltage to a logic circuit, it is disclosed in, for example, Patent literature 1 (Japan Patent Application Laid-Open (JP-A) No. 2011-186934) and Patent literature 2 (Japan Patent Application Laid-Open (JP-A) No. 2014-038382).

A power blocking signal Spsco is generated by a CPU; a logic circuit 10 that blocks power voltage via a P channel MOS transistor Q1 covers a large logic circuit that is constructed as one application unit. Therefore, it takes relatively longer time to restore the level of a supplying voltage Vdd1.

As described above, the power voltage blocking circuit is operated at a system level. Therefore, the following problem is generated: after an active signal and the power voltage are set to be turned on, it takes considerable time to reach the activated state. In particular, under the circumstances where the power supply to flip-flop is blocked, the time for re-start becomes relatively longer. As a result of these time periods, the problem is that it is not possible to realize operation with no waiting time.

SUMMARY OF DISCLOSURE

A power control circuit according to the first disclosure is used for a logic circuit. The logic circuit performs a predetermined logic calculation on a plurality of input signals from a first memory part, and outputs a plurality of output signals after the logic calculation. The first memory part temporarily stores the plurality of input signals and outputs the input signals. The power control circuit is characterized in:

supplying a predetermined power voltage to the first memory part, the power control circuit comprises:

a switch part, selectively switching between whether to supply the power voltage to the logic circuit or not;

a plurality of detector circuits, respectively detecting a change of a signal level of a plurality of input signals input to the first memory part, when the change of the signal level is detected, detect signals are output respectively; and a control circuit, controlling the switch part to supply the power voltage to the logic circuit via the at least one detect signal from the plurality of detector circuits, on the other hand, when the detect signals are not output from the plurality of detector circuits, controlling the switch part not to supply the power voltage to the logic circuit.

Furthermore, in the power control circuit, the power control circuit is used for a logic circuit device. The logic circuit device has multi-stage logic circuits according to the first disclosure, and is constructed by the multi-stage logic circuits that are connected stage by stage via the first memory part; the power control circuit is characterized in, supplying a predetermined power voltage to the first memory part, the power control circuit comprises:

a plurality of switch parts, comprising a first-stage to a multi-stage switch parts, selectively switching between whether to supply the power voltage to the multi-stage logic circuit respectively or not;

a plurality of detector circuits, respectively detecting a change of a signal level of a plurality of input signals input to the first memory part, when the change of the signal level is detected, detect signals are output respectively;

a control circuit, generating a power control signal, based on at least one detect signal from the plurality of detector circuits, the power control signal controls the first-stage switch part to supply the power voltage to the logic circuit, on the other hand, when the detect signal is not output from the plurality of detector circuits, the power control signal controls the first-stage switch part not to supply the power voltage to the logic circuit;

and a second memory part, temporarily memorizing the power control signal along with the clock of the logic circuit simultaneously, and generating the next stage power control signal to output the next stage power control signal to the second-stage switch part.

The logic circuit device according to the second disclosure is characterized in comprising the power control circuit.

DESCRIPTION OF EMBODIMENTS

Figure 1:
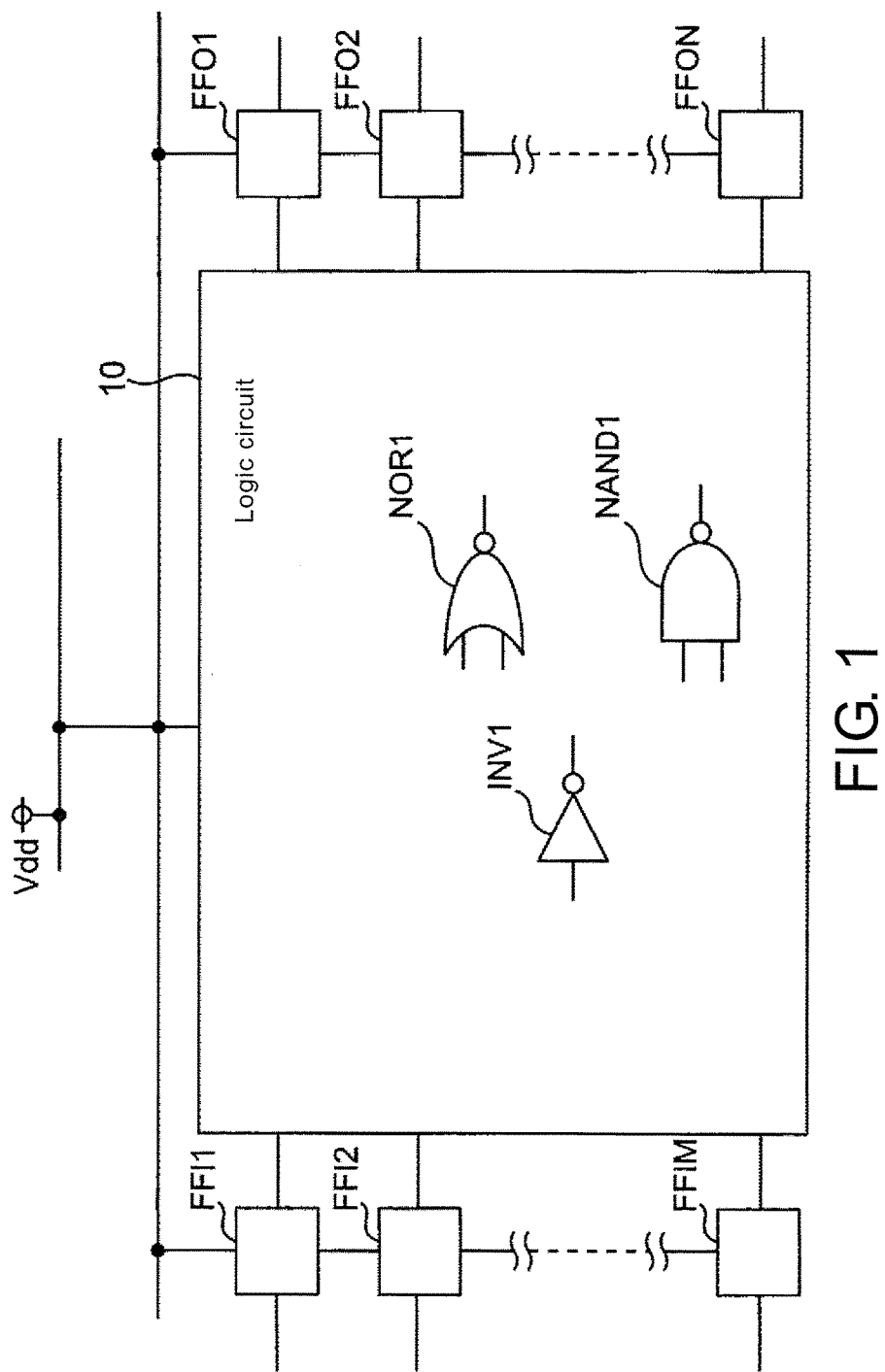
FIG. 1 is a block diagram illustrating a logic circuit and a structure of a power control circuit according to conventional example 1.
Figure 2:
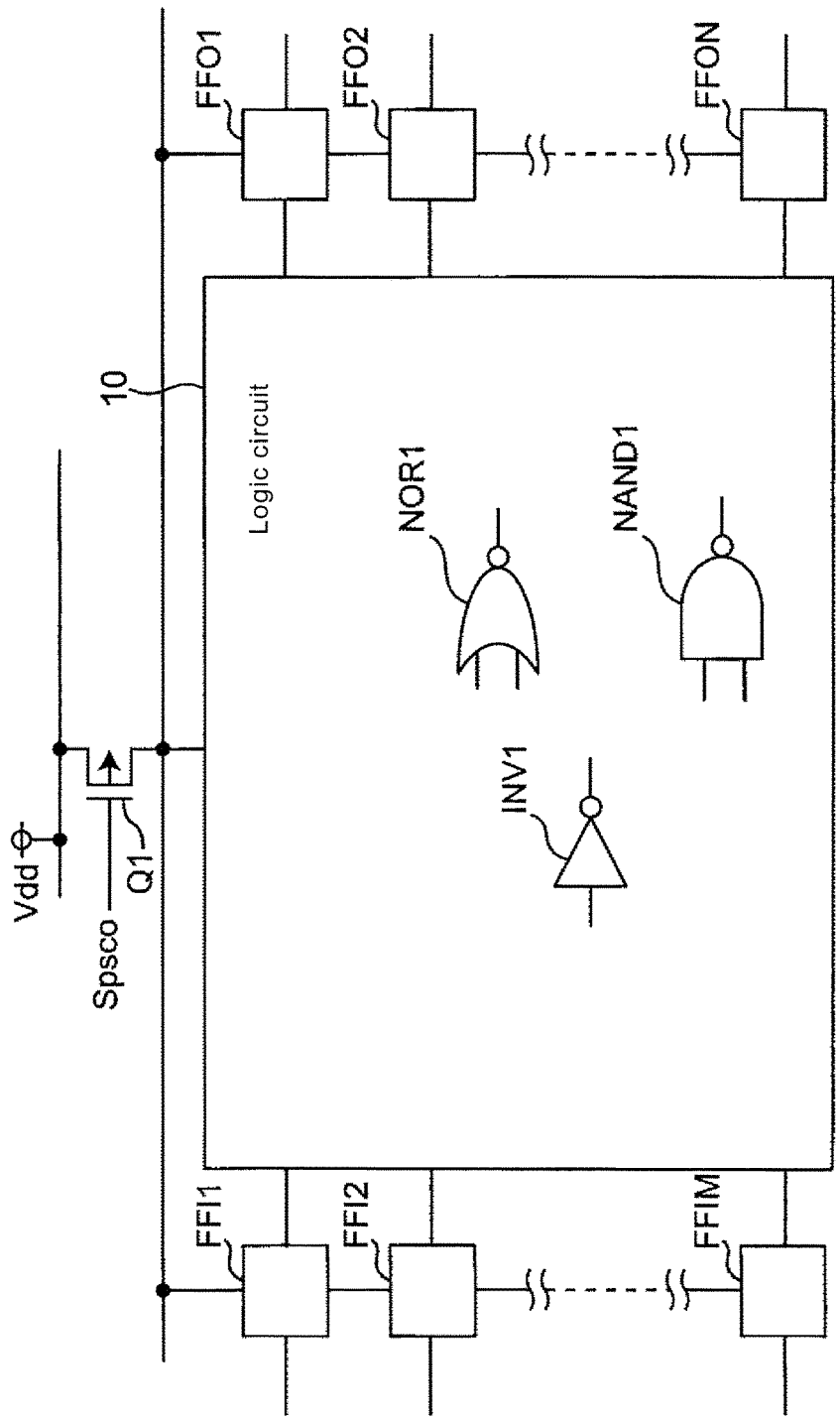
FIG. 2 is a block diagram illustrating a logic circuit and a structure of the power control circuit according to conventional example 2.
Figure 3:
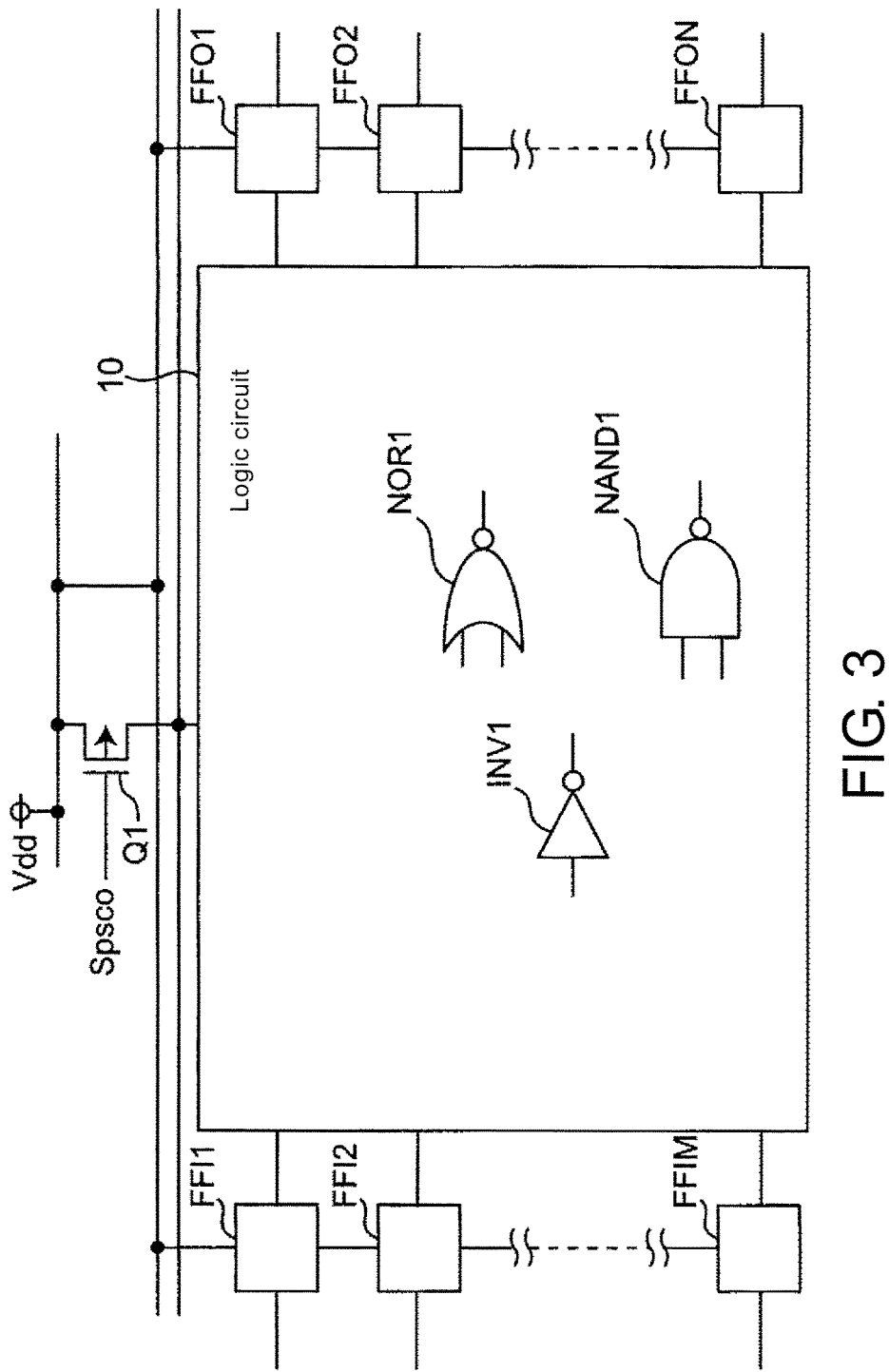
FIG. 3 is a block diagram illustrating a logic circuit and a structure of a power control circuit according to conventional example 3.
Figure 4:
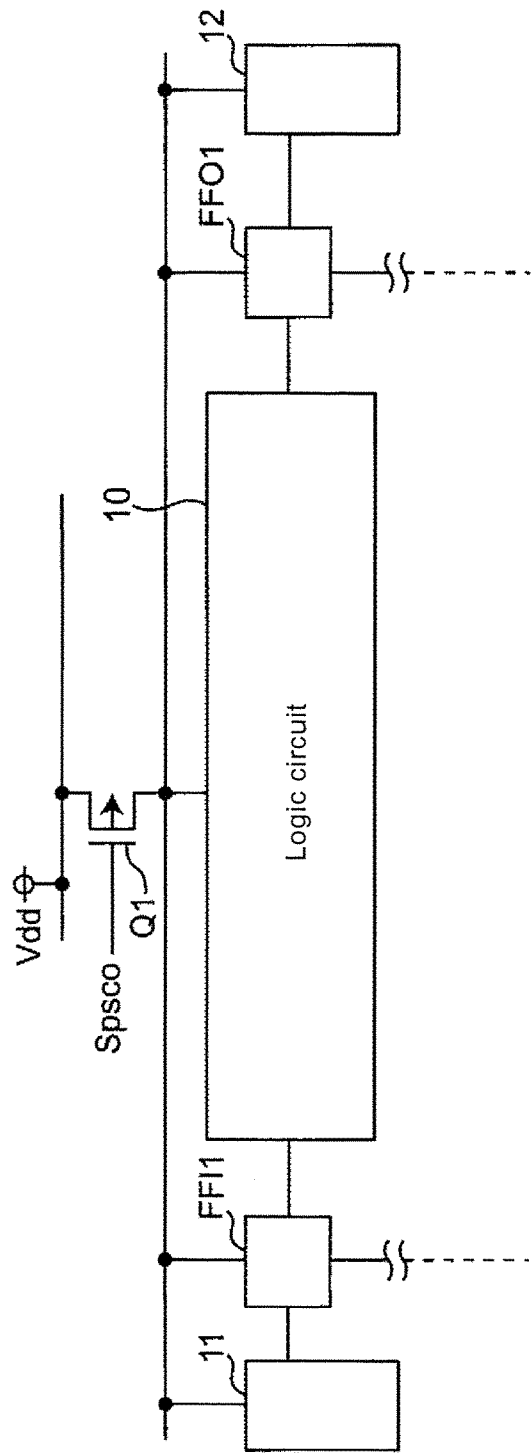
FIG. 4 is a block diagram illustrating a logic circuit and a structure of a power control circuit according to conventional example 4.

The disclosure solves the above-mentioned problem by providing a power control circuit for a logic circuit, which can reduce the waiting time for restoring power voltage as compared with conventional examples, and providing a power control circuit and a logic circuit device having the power control circuit that reduce power consumption.

In the power control circuit, the control circuit controls the switch part according to the at least one detect signal from the plurality of detector circuits to simultaneously supply power voltage to the logic circuit along with a clock of the logic circuit after the time period in which the predetermined delay time is delayed from the detect signal.

Also, it is characterized in that, in the power control circuit, the delay time is obtained by adding the time for 1 cycle of the clock of the logic circuit by a predetermined time.

Furthermore, it is characterized in that, in the power control circuit, the power control circuit further includes a comparing part which determines whether the voltage supplied by the power voltage to the logic circuit via the switch part is substantially equivalent to the power voltage, when the power voltage is substantially equivalent, a voltage sensing signal is output, the control circuit not only controls the at least one detect signal from the plurality of detector circuits, but also controls the switch part to supply the power voltage to the logic circuit based on the voltage sensing signal.

According to the power control circuit of the disclosure, in the power control circuit for logic circuit, the waiting time for restoring power voltage can be shortened as compared with conventional example, and power consumption can be reduced.

In order to make the aforementioned features and advantages of the disclosure more comprehensible, embodiments accompanying figures are described in detail below.

The following paragraphs describe embodiments of the disclosure. In the drawings, the same or similar elements are denoted by the same reference numerals, and repeated descriptions will be omitted.

In the disclosure, the embodiment is related to low power consumption in a logic circuit. The purpose of the disclosure is that, even if under the circumstances where current leakage in the logic circuit is increased and the current leakage is large, the current in standby state is suppressed to be lower. The most important items in the embodiment are as follows.

Figure 5:
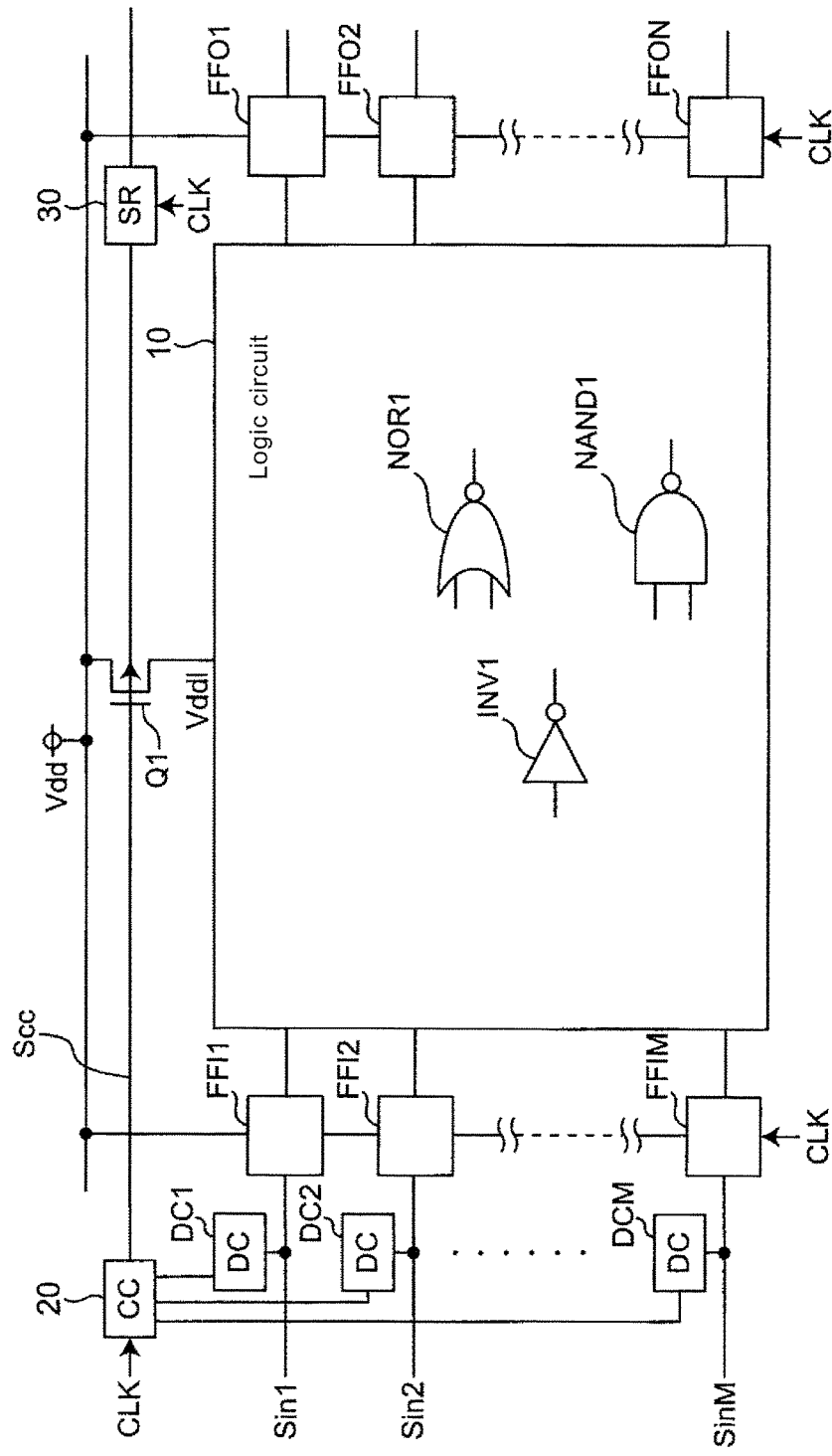
FIG. 5 is a block diagram illustrating a logic circuit and a structural example of a power control circuit according to embodiment 1.
Figure 10:
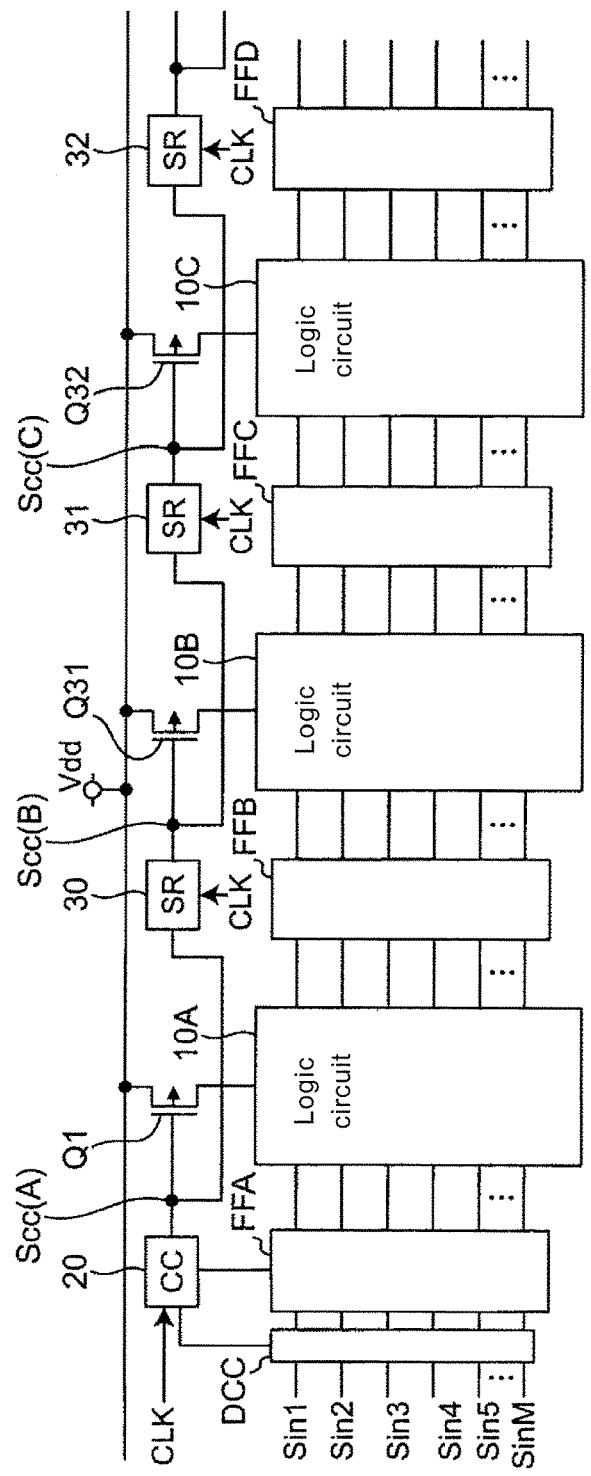
FIG. 10 is a block diagram illustrating a logic circuit device and a structural example of a power control circuit in embodiment 2.

It does not waste time to from changing to the state of power supply signal to an operation state. Meanwhile, the item does not realize operation in waiting time. In the aspect, although a power blocking transistor is included, the size of the transistor is relative small. The extension of the power blocking is minor. As relative to one application unit, a plurality of power blocking transistors are existed; the item applies to the circuit that is not often in use such as security circuit and the like that requires immediate action. The point of the item is as follows.
(1) Detector circuits DC1-DCM that detect the change of input signal of delay type flit-flop are included (FIG. 5).
(2) A control circuit 20 controls a power voltage blocking MOS transistor Q1 based on a detect signal from the detector circuits DC1-DCM, and controls the next stage power voltage blocking MOS transistors Q31 and Q32 and so on via a shift register (SR) 30 that is disposed when the logic circuit 10 has a multi-stage structure (FIG. 10).
(3) No power blocking control is performed on the delay type flip-flops FFI1-FFIM and FFO1-FFON.

Embodiment 1

FIG. 5 is a block diagram illustrating a logic circuit and a structural example of a power control circuit (which refers to a circuit other than the logic circuit, the same applies to the following description, which also includes a logic circuit and a power control circuit and is thus referred to as a logic circuit device) according to embodiment 1. As compared with the circuit in FIG. 1, the circuit in FIG. 5 has the following difference.
(1) Detector circuits (DC) DC1-DCM are included. The detector circuits (DC) DC1-DCM respectively detect the change of each of the input signals input to the delay type flip-flops FFI1-FFIM at the input side, and the detect signal is output as one pulse signal.
(2) A control circuit (CC) 20 is included. The control circuit (CC) 20 generates a power control signal Scc at an L level in response to the detect signal, and applies the power control signal Scc to the switch part or the gate of the P channel MOS transistor Q1 for power control that serves as the switch element and the SR 30. The SR 30 delays the input power control signal Scc for, for example, one clock (which may also be replaced by a predetermined pulse period), and the power control signal is output to the next stage MOS transistor for power control and SR.
(3) The delay type flip-flops FFI1-FFIN at the input side and the delay type flip-flops FFO1-FFON at the output side that respectively serve as temporary memory part are included, which directly apply power voltage Vdd without using the P channel MOS transistor Q1 for power control.

In FIG. 5, when each of the detector circuits DC1-DCM respectively detect the change of the signal level of input signals Sin1-SinM, the detect signal that serves as one pulse signal is output to the control circuit 20. The control circuit 20 simultaneously generates the power control signal Scc at the L level along with the clock CLK in response to the detect signal, and the power control signal Scc is output to the gate of the P channel MOS transistor Q1 and output to the SR 30. The SR 30 simultaneously outputs the power control signal Scc to the next stage circuit along with the next clock CLK based on the input power control signal Scc. When the power control signal Scc at the L level is applied to the gate of the P channel MOS transistor Q1, the MOS transistor Q1 is turned on, the power voltage Vdd serves as the supply voltage Vdd1 and is supplied to the logic circuit 10 that performs predetermined logic calculation via the MOS transistor Q1, and the logic circuit 10 performs operation.

Figure 6:
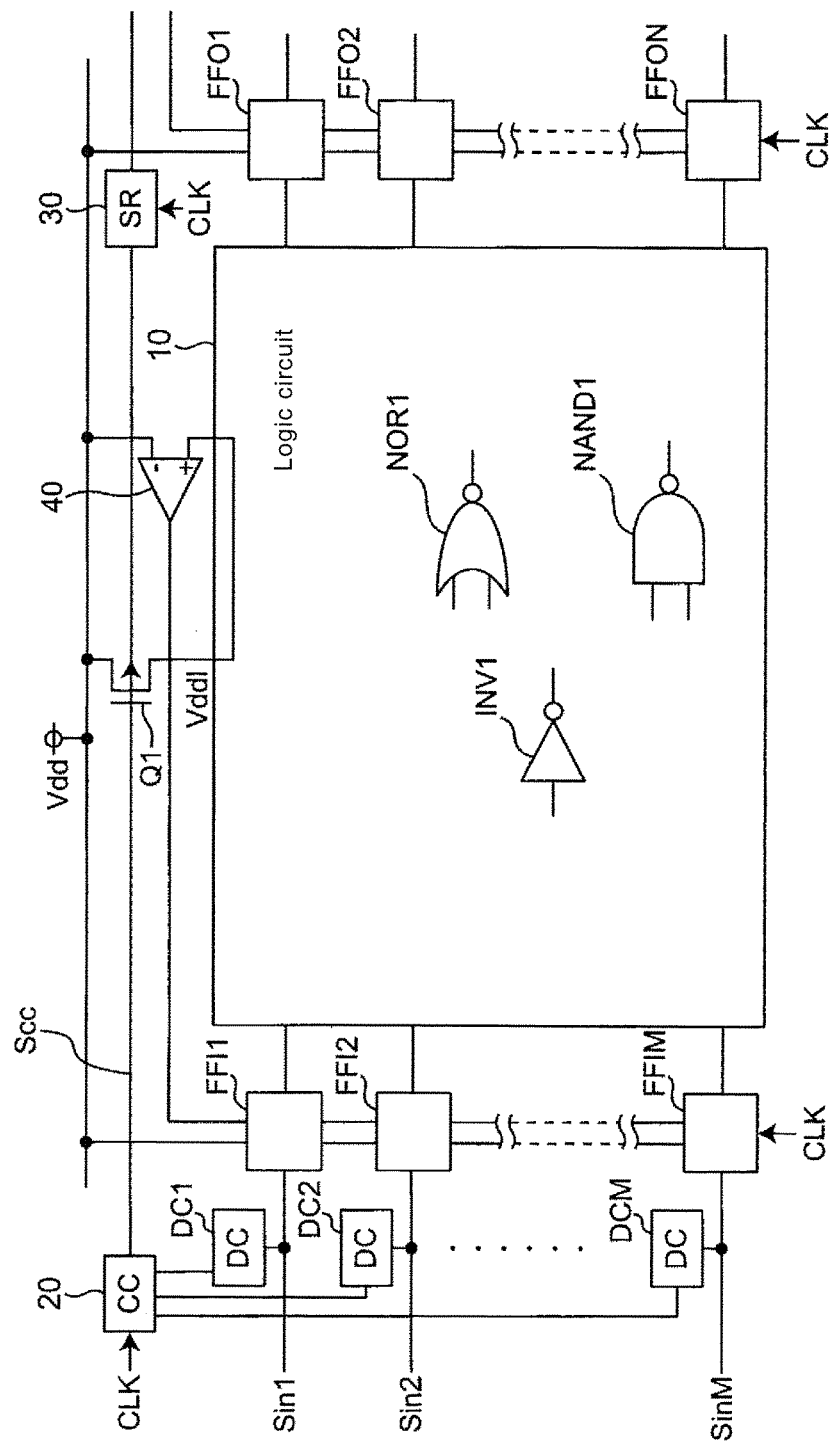
FIG. 6 is a block diagram illustrating a logic circuit and a structural example of a power control circuit thereof in a modification example 1 of embodiment 1.

FIG. 6 is a block diagram illustrating a logic circuit and a structural example of a power control circuit in modification example 1 of embodiment 1. As compared with the circuit in FIG. 5, the circuit in FIG. 6 has differences as follows.
(1) A comparator 40 is included. When the supply voltage Vdd1 is substantially equal to the power voltage Vdd (Vdd1≈Vdd), i.e., specifically Vdd1=Vdd±ΔVd (in a minor voltage range), the comparator 40 outputs the voltage sensing signal Svs at an H level to each of the delay type flip-flops FFI1-FFIM.
(2) Each of the delay type flip-flops FFI1-FFIM respectively output an output signal only when the voltage sensing signal Svs at the H level is input.

In other words, in the circuit in FIG. 6, when the change of signal level of the input signals Sin1-SinM is detected, the control circuit 20 applies the voltage sensing signal Scc at the L level to the gate of the MOS transistor Q1. At this time, when the MOS transistor Q1 is set as in the on state, the comparator 40 detects that Vdd1≈Vdd and outputs the voltage sensing signal Svs to each of the delay type flip-flops FFI1-FFIM. In responding to that, each of the delay type flip-flops FFI1-FFIM respectively outputs the input signals Sin1-SinM to the logic circuit 10. In other words, after the power supply to the logic circuit 10 is conformed, the logic circuit 10 may start to perform operation and thus it can be prevented that the logic circuit 10 performs erroneous operation.

The circuit using the comparator 40 in FIG. 6 may also be applied to other embodiments and other modification examples.

Figure 7A:
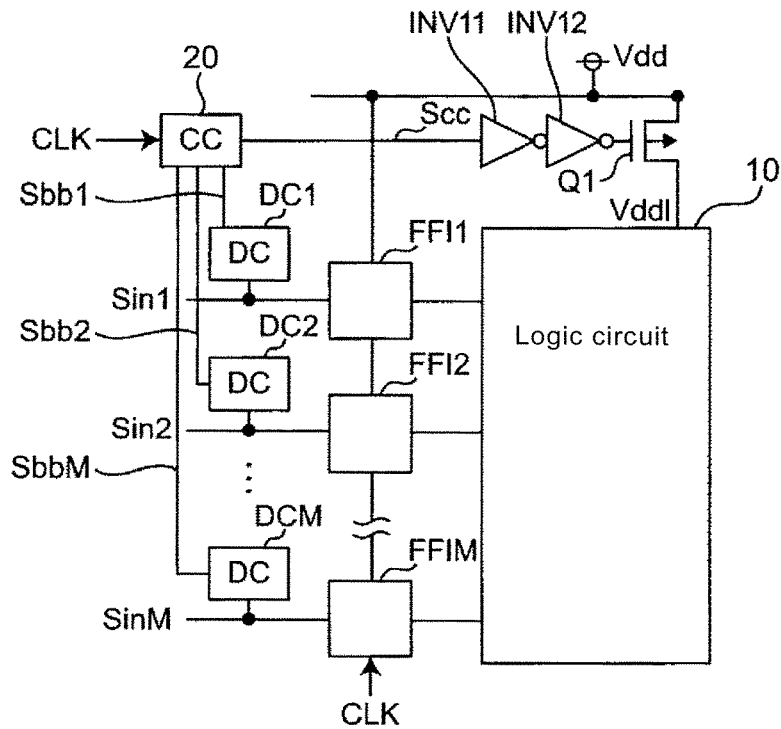
FIG. 7A is a block diagram illustrating a logic circuit and a structural example of a power control circuit in modification example 2 in embodiment 1.
Figure 7B:
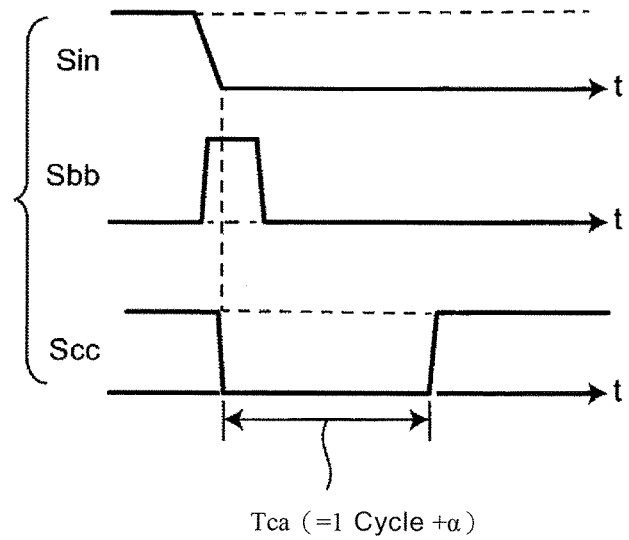
FIG. 7B is a time chart illustrating an operation example of a circuit in FIG. 7A.

FIG. 7A is a block diagram illustrating a logic circuit and a structural example of the power control circuit thereof in modification example 2 of embodiment 1. Meanwhile, FIG. 7B is a time chart illustrating an operation example of the circuit in FIG. 7A. As compared with the circuit in FIG. 5, the circuit in FIG. 7A has difference as follows.
(1) Two inverters INV11 and INV12 for adjusting signal time that are connected in series are inserted between an output terminal of the power control signal Scc of the control circuit 20 and the gate of the MOS transistor Q1.

In the circuit of FIG. 7A, the detector circuits DC1-DCM are respectively connected to each input terminal of the delay type flip-flops FFI1-FFIM. When the input signals Sin1-SinM input to each of the flip-flops FFI1-FFIM are changed, as shown in FIG. 7B, the detector circuits DC1-DCM generate detect signals Sbb1-SbbM that serve as one pulse signal to be output to the control circuit 20. When one of the plurality of detector circuits DC1-DCM inputs the detect signal to the control circuit 20, the control circuit 20 generates the power control signal Sc at the L level, and the power control signal Scc is applied to the gate of P channel MOS transistor Q1 via the inverters INV11 and INV12. At this time, the power voltage Vdd is supplied to the logic circuit 10. Thereafter, the logic circuit 10 performs operation. Here, the pulse width of the pulse signals that serve as the detect signals Sbb1-SbbM (generally denoted as Sbb) is set to be the same as one cycle. After the power control signal Scc drops for one cycle, if there is no change in the input signals Sin1-SinM input to the delay type flip-flops FFI1-FFIM, the control circuit 20 makes the power control signal Scc to be changed to a high level after the drop of the power control signal Scc passes a time period Tca (Tca+1 cycle+α), and the MOS transistor Q1 is set to be in an off state such that the power supply to the logic circuit 10 is automatically blocked.

Figure 8A:
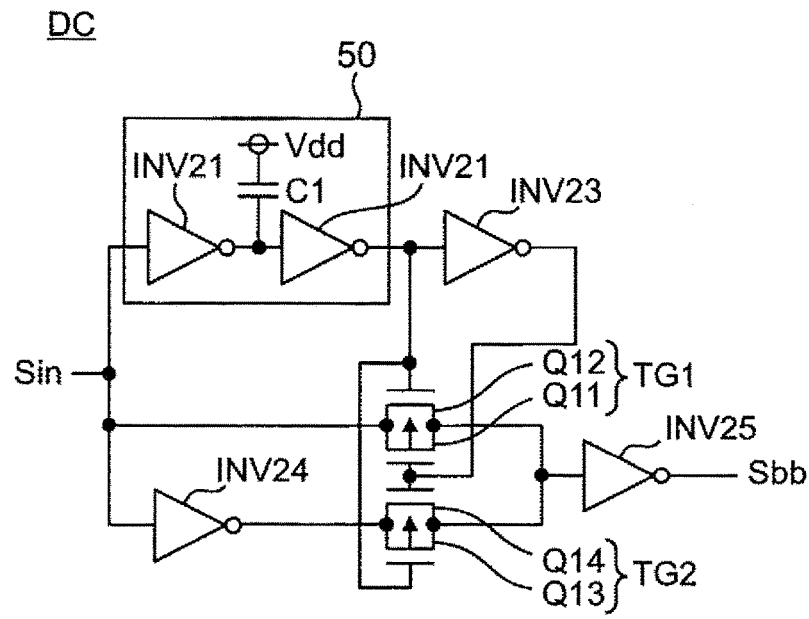
FIG. 8A is a circuit diagram illustrating a structural example of a detector circuit DC in FIG. 5.

FIG. 8A is a circuit diagram illustrating a structural example of detector circuits DC1-DCM (generally labeled as DC) in FIG. 5. Meanwhile, FIG. 8B is a time chart illustrating an operation example of a detector circuit DC in FIG. 8A.

FIG. 8A illustrates a delay circuit 50 having two inverters INV21 and INV22 and a capacitor C1; an inverter INV23; a latch circuit formed by a loop connected by an inverter INV24 and transmitting gates TG1 and TG2; and an output inverter INV25. The circuit in FIG. 8A includes a delay circuit that delays an input signal Sin, and a detector circuit that detects the signal change of exclusive disjunction of the input signal Sin.

Figure 8B:
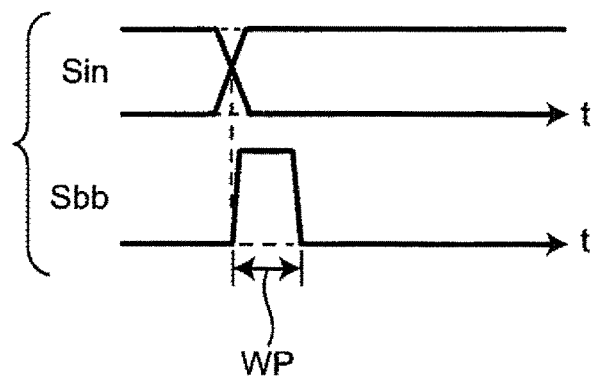
FIG. 8B is a time chart illustrating an operation example of a detector circuit DC in FIG. 8A.

As shown in FIG. 8B, when the input signal Sin is changed from high level to the low level, or changed from the low level to the high level, the output signal of the detector circuit generates the pulse signal (i.e. the detect signal Sbb) determining the pulse width (WP) thereof based on the delay time of the delay circuit 50. Here, the circuit in FIG. 8A is operated at a very high speed.

Figure 9:
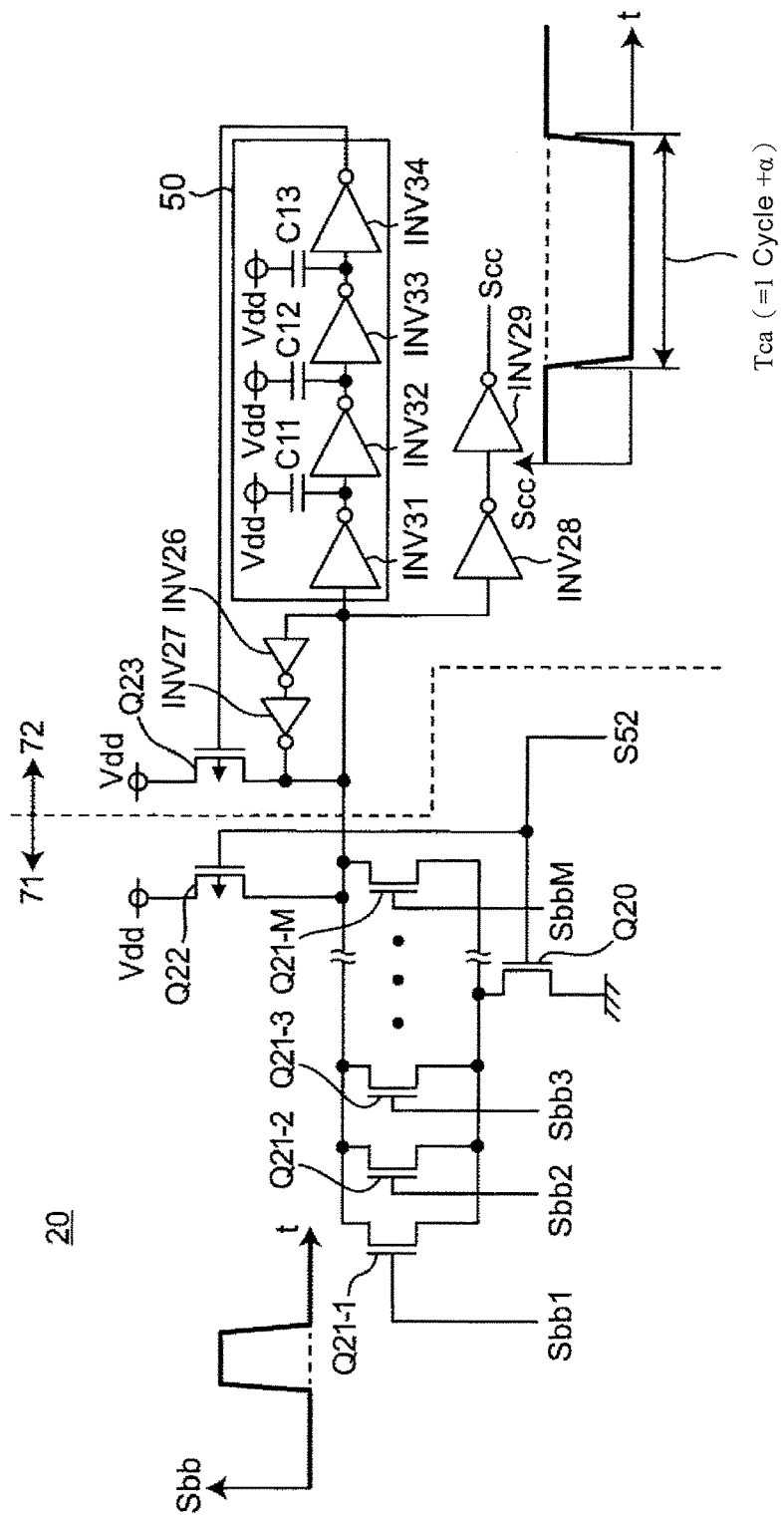
FIG. 9 is a circuit diagram illustrating a structural example of a control circuit 20 in FIG. 5.

FIG. 9 is a circuit diagram illustrating a structural example of the control circuit 20 in FIG. 5. In FIG. 9, the control circuit 20 is constructed by (1) an OR gate circuit 71 with respect to input signals Sbb1-SbbM and (2) a delay output circuit 72 that delays the output signal of the OR gate circuit for a predetermined time period. Here, the OR gate circuit 71 is constructed by the MOS transistors Q21-1~Q21-M, Q20 and Q22. Here, S52 is, for example, a chip enable signal is an operation control signal that becomes high level when being activated and becomes low level when not being activated. Meanwhile, the delay output circuit 72 is constructed by the MOS transistor Q23, inverters INV26 and INV27, the delay circuit 50 and inverters INV28 and INV29. The delay circuit 50 is constructed by four inverters INV31-INV34 and three capacitors C11-C13.

The control circuit 20 constructed in the manner described above generates one pulse signal in response to at least one pulse signal among a plurality of input signals (i.e. M input signals Sbb1-SbbM), and the delays the predetermined delay time to generate the power control signal Scc at the low level in the time period Tea and output the power control signal Scc.

Based on the logic circuit of the power control circuit as constructed in the manner described above in the embodiment 1 or the modification example thereof, when the change of signal level of the input signals Sin1-SinM are respectively detected, each of the detector circuits DC1-DCM outputs the detect signals Sbb1-SbbM that serve as one pulse signal to the control circuit 20. The control circuit 20 simultaneously generates the power control signal Scc at the L level along with the clock CLK in response to at least one of the input signals Sin1-SinM, and outputs the power control signal Scc to the gate of the P channel MOS transistor Q1. In this manner, the MOS transistor Q1 is turned on, and the power voltage Vdd serves as the supply voltage Vdd1 to be supplied to the logic circuit 10 via the MOS transistor Q1, and thus the logic circuit 10 performs operation accordingly. With the above operation, in the power control circuit for logic circuit, the waiting time for restoring power voltage can be shortened as compared with conventional example, thereby reducing power consumption.

Embodiment 2

FIG. 10 is a block diagram illustrating a logic circuit device (which refers to a circuit device constructed by multi-stage logic circuits connected stage by stage) and a structural example of a power control circuit thereof according to embodiment 2. The circuit in FIG. 10 is characterized in that the circuit in FIG. 5 is used as the first stage. Thereafter, the circuits connected in stages following the second stage are connected. However, the detector circuit DCC is not connected stage by stage but connected to the delay type flip-flops FFA, that is, including:

(1) A delay type flip-flop circuit FFA including a plurality of, i.e., M delay type flip-flops FFI1-FFIM that respectively receive input signals Sin1-SinM;
(2) The detector circuit DCC including detector circuits DC1-DCM. The detector circuits DC1-DCM are connected to the delay type flip-flops FFI1-FFIM that respectively detect the input signals Sin1-SinM;
(3) A logic circuit 10A having the same structure as the logic circuit 10 (with the same logic structure), which performs logic operation on the plurality of input signal of the delay type flip-flop circuit FFA;
(4) A delay type flip-flop circuit FFB including a plurality of delay type flip-flops respectively receiving a plurality of output signals from the logic circuit 10A;
(5) A logic circuit 10B having the same structure as the logic circuit 10 (with the same logic structure), which performs logic operation on the plurality of output signals from the delay type flip-flop circuit FFB;
(6) A delay type flip-flop circuit FFC including a plurality of delay type flip-flops respectively receiving a plurality of output signals from the logic circuit 10B;
(7) A logic circuit 10C having the same structure as the logic circuit 10 (with the same logic structure), which performs logic operation on a plurality of output signals from the delay type flip-flop circuit FFC; and
(8) A delay type flip-flop circuit FFD including a plurality of delay type flip-fops respectively receiving a plurality of output signals from the logic circuit 10C.

The control circuit 20 performs the same operation as described in embodiment 1, which generates the power control signal Scc (A) at the L level and outputs the power control signal Scc (A) to the gate of the MOS transistor Q1 that controls power supply to the logic circuit 10A and the SR 30. The SR 30, which is the same as the SR 30 in FIG. 6, simultaneously delays the predetermined cycle period such as one cycle along with the clock CLK to use the delayed signal as the power control signal Scc (B) at the L level to be output to the gate of the MOS transistor Q31 that controls power supply to the logic circuit 10B and an SR 31. Meanwhile, the SR 31 is the same as the SR 30, which simultaneously delays the predetermined cycle period along with the clock CLK to use the delayed signal as the power control signal Scc (C) at the L level to be output to the gate of the MOS transistor Q32 that controls the power supply to the logic circuit 10C and an SR 32. Furthermore, the SR 32 also performs the same operation.

In the circuit in FIG. 10 that is constructed in the manner described above, when there is no level change in the input signals Sin1-SinM, the control circuit 20 generates the power control signal Scc (A) at the H level; in this manner, the MOS transistor Q1 is turned off, the power voltage Vdd is not supplied to the logic circuit 10A and no operation is performed thereon. Next, in the next cycle, the power control signal Scc (B) from the SR 30 becomes H level, and the MOS transistor Q31 is set to be turned off and the power of the logic circuit 10B is set to be turned off. Thereafter, the logic circuit 10C also performs the same operation.

Figure 11A:
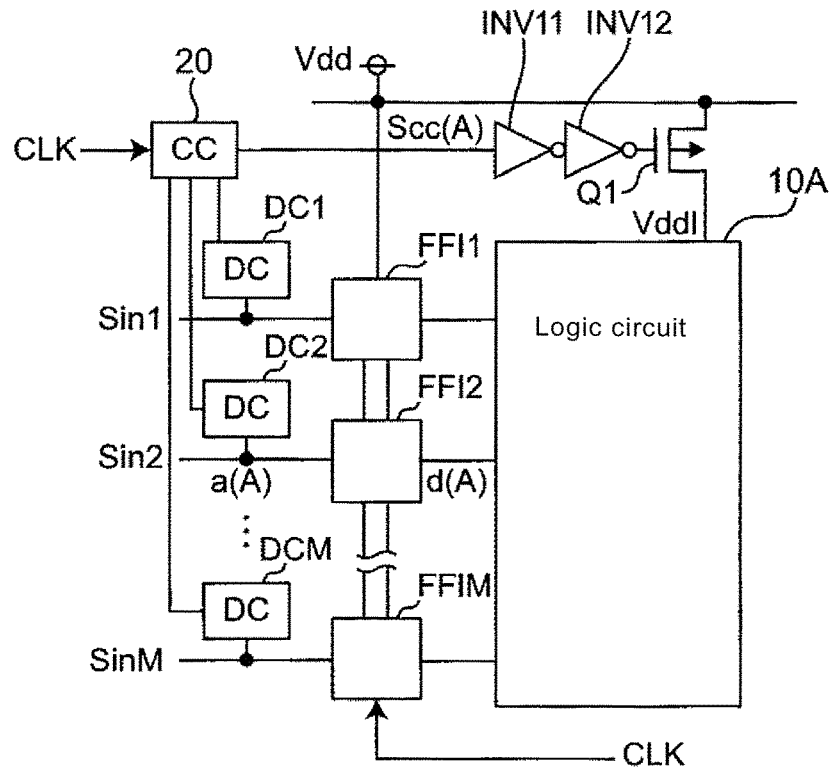
FIG. 11A is a block diagram illustrating a structural example of a first-stage circuit in embodiment 2.
Figure 11B:
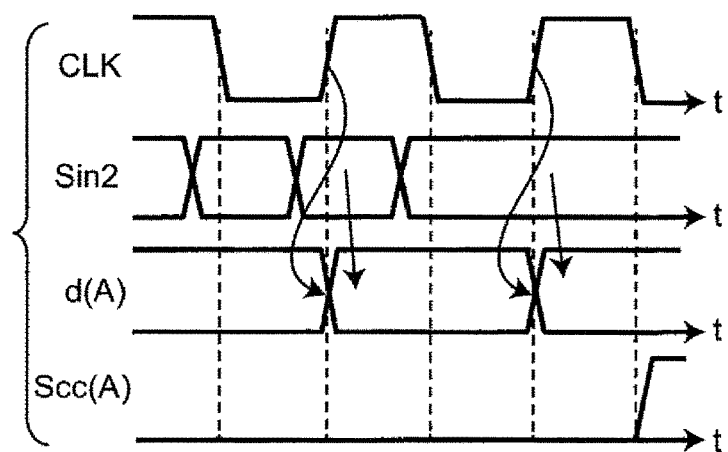
FIG. 11B is a time chart illustrating an operation example of a circuit in FIG. 11A.

FIG. 11A is a block diagram illustrating a structural example of a first stage circuit of the circuit in embodiment 2. Meanwhile, FIG. 11B is a time chart illustrating an operation example of the circuit in FIG. 11A. As compared with the circuit in FIG. 10, the only difference of the circuit in FIG. 11A is that there are inverters INV11 and INV12 inserted between the control circuit 20 and the gate of the MOS transistor Q1.

In the circuit in the embodiment 2, only the first stage circuit has the detector circuit DCC and the control circuit 20. The detector circuit DCC includes the detector circuits DC1-DCM respectively detecting the input signals Sin1-SinM. In the operation example of FIG. 11B, after the level of the input signal Sin2 is changed, along with the clock CLK, the input signal Sin2 is simultaneously transferred to the logic circuit 10A via a delay type flip-fop FFI2, and the MOS transistor Q1 is set to be turned on via the power control signal Scc (A), and power voltage Vdd is supplied to the logic circuit 10A. Signal a (A) is a input signal to the delay type flip-fop FFI2 and signal d (A) is a output signal from the delay type flip-fop FFI2.

Figure 12A:
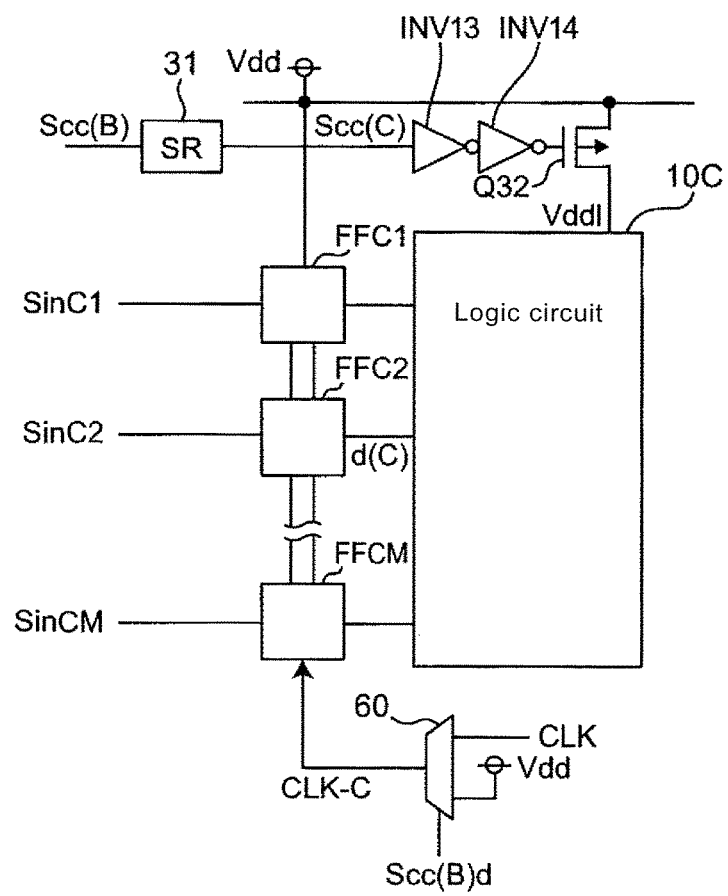
FIG. 12A is a block diagram illustrating a structural example of a circuit after the second stage of the circuit in embodiment 2.
Figure 12B:
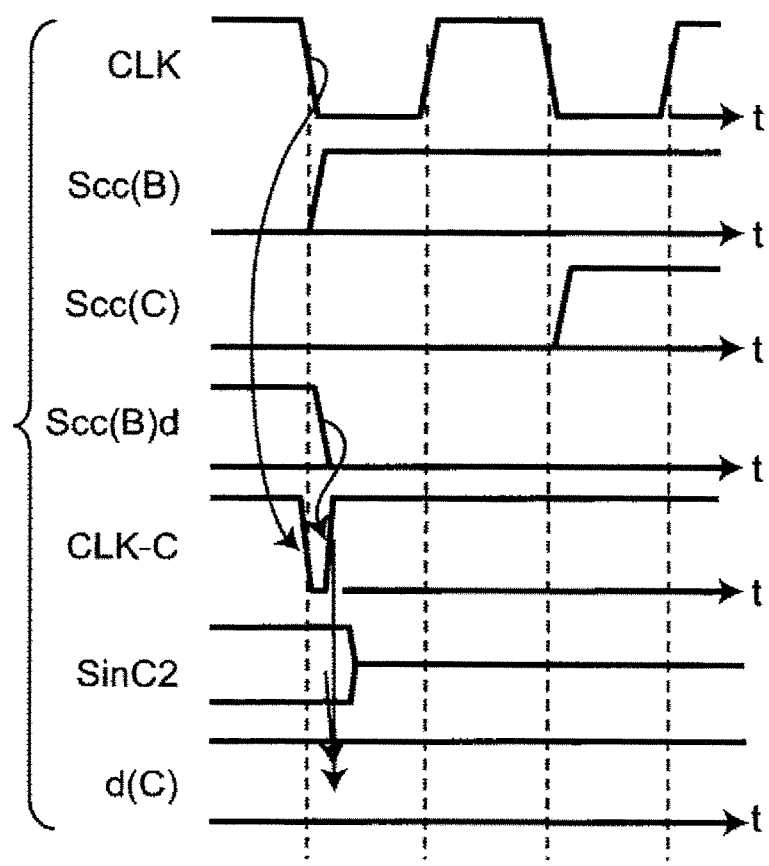
FIG. 12B is a time chart illustrating an operation example of a circuit in FIG. 12A.

FIG. 12A is a block diagram illustrating a structural example of a circuit after the second stage of the circuit in embodiment 2. Meanwhile, FIG. 12B is a time chart illustrating an operation example of the circuit in FIG. 12A. As compared with the circuit in FIG. 10, the only difference of the circuit in FIG. 12A is that there are inverters INV13 and INV14 inserted between the SR 31 and the gate of the MOS transistor Q32. Signals SinC1~SinCM are input signals to the delay type flip-flops FFC1-FFCM and Signal d (C) is output signal from the delay type flip-flop FFC2.

In the circuit after the second stage of the circuit in embodiment 2, in order to receive the power control signal Scc (B) from the SR 30 of the previous stage, a SR 31 is provided. Same as the SR 30, the SR 31, for example, delays one cycle to generate the power control signal Scc (C) at the L level and applies the same to the gate of the MOS transistor Q32 that controls power supply to the logic circuit 10C via the inverters INV13 and INV14. In FIG. 12B, the power control signal SCC (B) d is a delay power control signal generated after the power control signal Scc (B) delays the predetermined delay time and serves as a switch signal of a selector 60. Based on the power control signal Scc (B) d, when the logic circuit 10C is not in operation, the selector 60 outputs an H level signal that is not changed as a clock CLK-C to a plurality of, i.e., M delay type flip-flops FFC1-FFCM. On the other hand, when the logic circuit 10C performs operation, the clock CLK is selected to be used as the clock CLK-C to be output to a plurality of, i.e., M delay type flip-flops FFC1-FFCM.

It is already known that, the circuit that is constructed as shown in FIG. 12B generates the power control signal Scc (C) based on the power control signal Scc (B), and the circuit in FIG. 12A performs operation accordingly.

Figure 13:
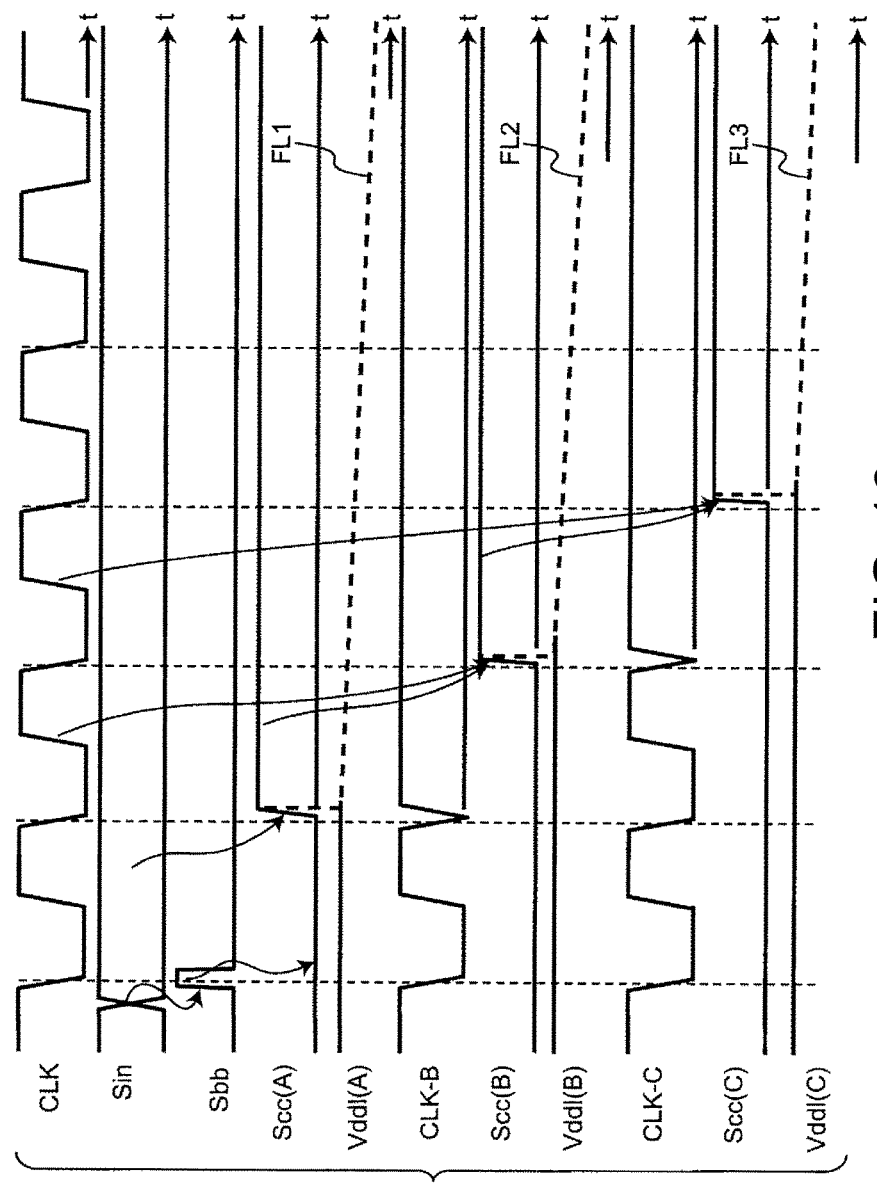
FIG. 13 is a time chart illustrating an operation example in which power supply for each of logic circuits 10A, 10B and 10C are turned off in sequence in the circuit in FIG. 10.
Figure 14:
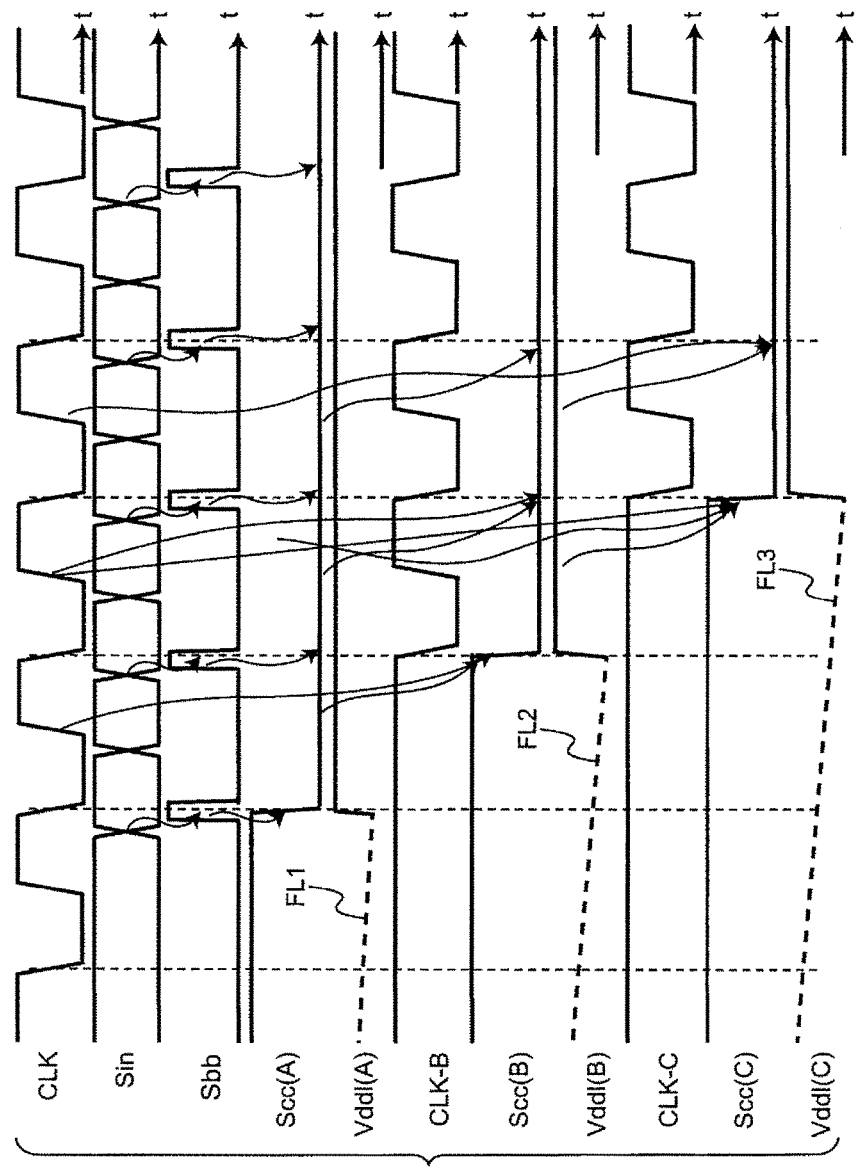
FIG. 14 is a time chart illustrating an operation example in which power supply for each of logic circuits 10A, 10B and 10C are turned on in sequence in the circuit in FIG. 10.
Figure 15:
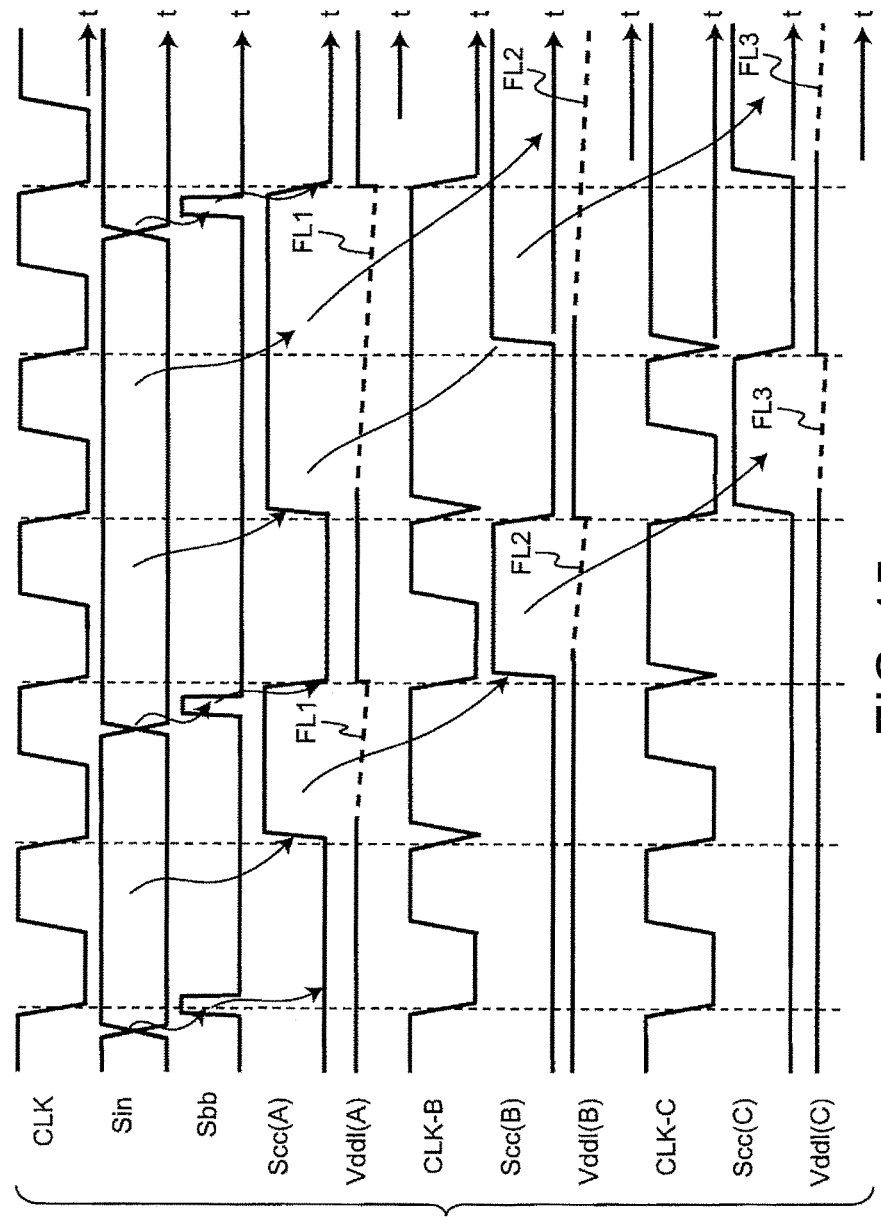
FIG. 15 is a time chart illustrating an operation example in which power supply for each of logic circuits 10A, 10B and 10C are turned on/off in sequence in the circuit in FIG. 10.

FIG. 13 is a time chart illustrating an operation example in which power supply for each of logic circuits 10A, 10B and 10C are turned off in sequence in the circuit in FIG. 10. FIG. 13 shows that, based on the power control signals Scc (A), Scc (B), Scc (C), the power supply to the logic circuits 10A, 10B, and 10C are turned off sequentially. In addition, FIGS. 13-15 show that FL1-FL3 represent a floating level of power voltage. Voltages Vdd1 (A), Vdd1 (B) and Vdd1 (C) are supply voltages to logic circuits 10A, 10B and 10C. Clock CLK-B is clock of logic circuit 10B.

FIG. 14 is a time chart illustrating an operation example in which power supply for each of logic circuits 10A, 10B and 10C are turned on in sequence in the circuit in FIG. 10. FIG. 13 shows that, based on the power control signals Scc (A), Scc (B) and Scc (C), the power supply to the logic circuits 10A, 10B and 10C are turned on sequentially.

FIG. 15 is a time chart illustrating an operation example in which power supply for each of logic circuits 10A, 10B and 10C are turned on/off in sequence in the circuit in FIG. 10. FIG. 15 shows that, based on the power control signals Scc (A), Scc (B) and Scc (C) that is generated according to the input signal Sin, the power supply to the logic circuits 10A, 10B and 10C are turned on or turned off.

In the logic circuit of the power control circuit that is constructed in the manner described above in the embodiment 2, same as the embodiment 1, the power supply to each of the logic circuits 10A, 10B and 10C are turned on based on the change of the input signal Sin. On the other hand, when the input signal Sin is not changed, the power supply to each of the logic circuits 10A, 10B and 10C is turned off. With the above-mentioned operation, in the power control circuit for the logic circuit, the waiting time for restoring the power voltage is shortened as compared with conventional example, and power consumption can be decreased.

Difference Between Patent Literature 1 and Patent Literature 2

In the Patent literature 1, in order to realize charge recycle that effectively reducing charge power of semiconductor device, the semiconductor device has a plurality of circuit blocks, local wires that supply power to the circuit blocks respectively, a global wire that supplies power to the local wires, a first switch disposed between each of the local wires and the global wire and a second switch disposed between two local wires. A determining part outputs a determining signal that represents that a potential difference between two local wires is below a reference value. The power control part 101 respectively controls on/off of the first switch and the second switch according to a power control command and the determining signal. However, in the semiconductor device of Patent literature 1, remaining charge brought by power blocking during a power blocking period serves as recycle charge of the activated circuit block, and thus cannot reduce power consumption like conventional example.

In Patent literature 2, in a fine grain power gating, in order to realize ideal energy reduction effect by slightly improving the system overhead, an idle cycle counter is provided. The idle cycle counter resets an idle cycle register when the idle cycle counter detects an input. When the input is not detected, the idle cycle counter is adding. The comparator compares an idle cycle held in the idle cycle register with data BEC held in a BEC register, and writes a trigger flag that is configured for power blocking operation or power non-blocking operation, i.e., a predict flag into a predict flag register according to a comparison result. A power blocker is connected between the power and a logic circuit block. When an idle period starts, the power supply is controlled according to the predict flag held in the predict flag register. However, since the power blocking is performed by using the idle cycle counter, like the conventional example, the power consumption cannot be reduced.

INDUSTRIAL APPLICABILITY

As described above in details, according to the power control circuit described in the disclosure, in the power control circuit used for logic circuit, the waiting time for restoring power voltage can be shortened as compared with conventional example and power consumption can be reduced.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A power control circuit, configured for a logic circuit, the logic circuit performing a predetermined logic calculation on a plurality of input signals from a first memory part and outputting a plurality of output signals after the logic calculation, the first memory part temporarily memorizing the plurality of input signals and outputting the input signals, the power control circuit being characterized in:
   supplying a predetermined power voltage to the first memory part,
   the power control circuit comprising:
   a switch part, selectively switching to provide the power voltage to the logic circuit;
   a plurality of detector circuits, respectively detecting a change of a signal level of the plurality of input signals input to the first memory part, when the change of the signal level is detected, detect signals are output respectively; and
   a control circuit, controlling the switch part to supply the power voltage to the logic circuit based on at least one detect signal from the plurality of detector circuits, and controlling the switch part not to supply the power voltage to the logic circuit when the detect signal is not output from the plurality of detector circuits.

2. The power control circuit according to claim 1, wherein the control circuit controls the switch part according to at least one detect signal from the plurality of detector circuits to simultaneously supply the power voltage to the logic circuit in response to a clock of the logic circuit after a time period in which a predetermined delay time is delayed from the detect signal.

3. The power control circuit according to claim 2, wherein the delay time is obtained by adding a time of one cycle of the clock of the logic circuit by a predetermined time.

4. The power control circuit according to claim 1, wherein:
   the power control circuit further comprises:
   a comparing part, determining whether a voltage supplied to the logic circuit by the power voltage via the switch part is substantially equal to the power voltage, when the power voltage is substantially equal, a voltage sensing signal is output,
   wherein the control circuit not only receives the at least one detect signal from the plurality of detector circuits, but also controls the switch part to supply the power voltage to the logic circuit according to the voltage sensing signal.

5. A logic circuit device comprising the power control circuit according to claim 1.

6. A power control circuit, configured for a logic circuit device, the logic circuit device has a multi-stage logic circuit formed by a cascade connecting a plurality of logic circuits via a first memory part, wherein each of the logic circuits of the multi-stage logic circuit performs a predetermined logic calculation on a plurality of input signals from the first memory part and outputs a plurality of output signals after the logic calculation, and the first memory part temporarily memorizes the plurality of input signals and outputs the input signals, the power control circuit being characterized in,
   supplying a predetermined power voltage to the first memory part,
   the power control circuit comprising:
   a plurality of switch parts, forming a plurality of stages, selectively switching to respectively supply the power voltage to the multi-stage logic circuit;
   a plurality of detector circuits, respectively detecting a change of a signal level of the plurality of input signals input to the first memory part, when the change of the signal level is detected, detect signals are output respectively;
   a control circuit, generating a power control signal, according to the at least one detect signal from the plurality of detector circuits, the power control signal controls the first stage of the switch parts to supply the power voltage to the logic circuit, and when the detect signal is not output from the plurality of detector circuits, the power control signal controls the first stage of the switch parts not to supply the power voltage to the logic circuit; and
   a second memory part, temporarily memorizing the power control signal in response to the clock of the logic circuit simultaneously, and generating a next stage power control signal to be output to the second stage of the switch parts.

* * * * *